(12) United States Patent
Lai et al.

(10) Patent No.: US 12,310,114 B2
(45) Date of Patent: *May 20, 2025

(54) DISPLAY PANEL AND DISPLAY DEVICE

(71) Applicant: Xiamen Tianma Micro-Electronics Co., Ltd., Xiamen (CN)

(72) Inventors: Qingjun Lai, Xiamen (CN); Yihua Zhu, Xiamen (CN); Yong Yuan, Xiamen (CN); Ping An, Xiamen (CN); Zhaokeng Cao, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/384,593

(22) Filed: Oct. 27, 2023

(65) Prior Publication Data

US 2024/0063226 A1    Feb. 22, 2024

Related U.S. Application Data

(63) Continuation of application No. 17/451,136, filed on Oct. 15, 2021, now Pat. No. 11,837,606.

(30) Foreign Application Priority Data

Dec. 31, 2020 (CN) .......................... 202011637184.4

(51) Int. Cl.
| | | |
|---|---|---|
| *G11C 19/00* | (2006.01) | |
| *G09G 3/3266* | (2016.01) | |
| *G11C 19/28* | (2006.01) | |
| *H10D 86/40* | (2025.01) | |
| *H10D 86/60* | (2025.01) | |

(52) U.S. Cl.
CPC .......... *H10D 86/60* (2025.01); *G09G 3/3266* (2013.01); *G11C 19/28* (2013.01); *H10D 86/423* (2025.01); *G09G 2310/0286* (2013.01)

(58) Field of Classification Search
CPC ............ G11C 19/28; G09G 2310/0286; H01L 27/1229; H01L 27/1222; H01L 27/1225; H01L 27/3262; H01L 29/66969; H01L 29/7869

See application file for complete search history.

(56) References Cited

U.S. PATENT DOCUMENTS

| | | |
|---|---|---|
| 8,493,524 B2 | 7/2013 | Her et al. |
| 10,622,430 B2 | 4/2020 | Jeong et al. |
| 2006/0033105 A1 | 2/2006 | Fujii et al. |

(Continued)

*Primary Examiner* — Tuan T Lam
(74) *Attorney, Agent, or Firm* — Anova Law Group, PLLC

(57) ABSTRACT

A display panel includes at least one driving circuit and at least one pixel circuit. A driving circuit of the at least one driving circuit provides a driving signal for a pixel circuit of the at least one pixel circuit. The driving circuit includes N-level shift registers cascaded with each other. N is greater than or equal to two. The pixel circuit provides a display signal for a display unit of the display panel. A shift register of the N-level shift registers includes at least one first transistor. The at least one first transistor includes at least one first active layer, and an active layer with a largest area among the at least one first active layer is a first preset active layer. The pixel circuit includes at least one second transistor. The at least one second transistor includes at least one second active layer.

20 Claims, 7 Drawing Sheets

(56) References Cited

U.S. PATENT DOCUMENTS

| | | |
|---|---|---|
| 2018/0122298 A1 | 5/2018 | Lee et al. |
| 2020/0203382 A1* | 6/2020 | Jung .................. H01L 23/552 |
| 2020/0312209 A1* | 10/2020 | Yang .................. G09G 3/20 |
| 2021/0057458 A1* | 2/2021 | Kim .................. H01L 27/1285 |
| 2021/0312869 A1 | 10/2021 | Dai et al. |
| 2023/0180543 A1 | 6/2023 | Jin-Sung et al. |

* cited by examiner

DISPLAY PANEL AND DISPLAY DEVICE

CROSS-REFERENCE TO RELATED APPLICATION

This application is a continuation of U.S. patent application Ser. No. 17/451,136, filed on Oct. 15, 2021, which claims the priority of Chinese patent application No. 202011637184.4, filed on Dec. 31, 2020, the entirety of all of which is incorporated herein by reference.

FIELD

The present disclosure generally relates to the field of display technology and, more particularly, relates to a display panel and a display device.

BACKGROUND

With the development of display technology, the display panel has become more and more widely applied, and has gradually become an indispensable component of various electronic devices. Therefore, the quality of the display panel has gradually become an important factor affecting user experience.

However, the existing display panel is at a substantially high risk of being damaged in practical applications, such that the user experience still needs to be improved. —The disclosed display panel and display device are directed to solve one or more problems set forth above and other problems.

SUMMARY

One aspect of the present disclosure provides a display panel. The display panel includes at least one driving circuit and at least one pixel circuit. A driving circuit of the at least one driving circuit provides a driving signal for a pixel circuit of the at least one pixel circuit, the driving circuit includes N-level shift registers cascaded with each other, where N is greater than or equal to two, and the pixel circuit provides a display signal for a display unit of the display panel. A shift register of the N-level shift registers includes at least one first transistor, wherein the at least one first transistor includes at least one first active layer, and an active layer with a largest area among the at least one first active layer is a first preset active layer. The pixel circuit includes at least one second transistor, the at least one second transistor includes at least one second active layer, an active layer with a largest area among active layers containing silicon of the at least one second active layer is a second preset active layer, and an active layer with a largest area among active layers containing an oxide semiconductor of the at least one second active layer is a third preset active layer. The first preset active layer is an active layer containing silicon, the shift register of the N-level shift registers further includes a fourth preset active layer, and an active layer with a largest area among active layers containing oxide semiconductor of the at least one first active layer is the fourth preset active layer; or the first preset active layer is an active layer containing oxide semiconductor, the shift register of the N-level shift registers further includes a fourth preset active layer, and an active layer with a largest area among active layers containing silicon of the at least one first active layer is the fourth preset active layer. A sum of an area of the first preset active layer and an area of the fourth preset active layer is greater than a sum of an area of the second preset active layer and an area of the third preset active layer.

Another aspect of the present disclosure provides a display device. The display device includes a display panel. The display panel includes at least one driving circuit and at least one pixel circuit. A driving circuit of the at least one driving circuit provides a driving signal for a pixel circuit of the at least one pixel circuit, the driving circuit includes N-level shift registers cascaded with each other, wherein N is greater than or equal to two, and the pixel circuit provides a display signal for a display unit of the display panel. A shift register of the N-level shift registers includes at least one first transistor, wherein the at least one first transistor includes at least one first active layer, and an active layer with a largest area among the at least one first active layer is a first preset active layer. The pixel circuit includes at least one second transistor, the at least one second transistor includes at least one second active layer, an active layer with a largest area among active layers containing silicon of the at least one second active layer is a second preset active layer, and an active layer with a largest area among active layers containing an oxide semiconductor of the at least one second active layer is a third preset active layer. The first preset active layer is an active layer containing silicon, the shift register of the N-level shift registers further includes a fourth preset active layer, and an active layer with a largest area among active layers containing oxide semiconductor of the at least one first active layer is the fourth preset active layer; or the first preset active layer is an active layer containing oxide semiconductor, the shift register of the N-level shift registers further includes a fourth preset active layer, and an active layer with a largest area among active layers containing silicon of the at least one first active layer is the fourth preset active layer. A sum of an area of the first preset active layer and an area of the fourth preset active layer is greater than a sum of an area of the second preset active layer and an area of the third preset active layer.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

The present disclosure will be described in detail in conjunction with schematic diagrams. When describing the embodiments of the present disclosure in detail, for ease of description, the cross-sectional view showing the device structure may be partially enlarged not according to a general scale, and the schematic diagram may be merely an example, which may not limit the scope of the present disclosure. In addition, the three-dimensional dimensions of length, width and depth should be included in actual production.

In practical applications, the existing display panel is at a substantially high risk of being damaged, such that the user experience still needs to be improved. When the display panel is in operation, static charges will be generated in a frame region of the display panel, and the static charges will pass through the frame region and be transferred to a display region of the display panel, which will easily cause damages on the display region of the display panel, affect the quality of the display panel, and reduce user experience.

Figure 1:
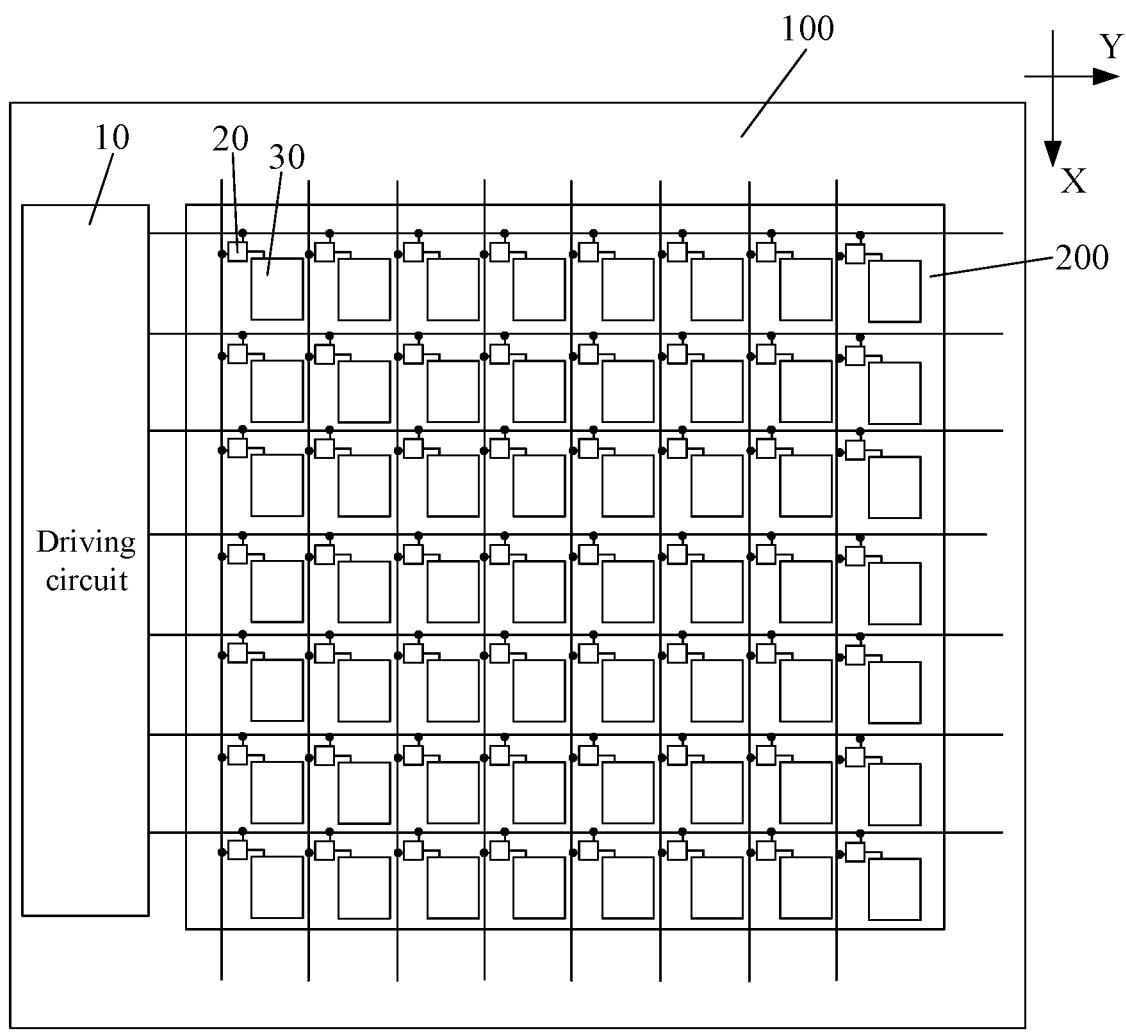
FIG. 1 illustrates a schematic top-view of an exemplary display panel consistent with disclosed embodiments of the present disclosure.
Figure 2:
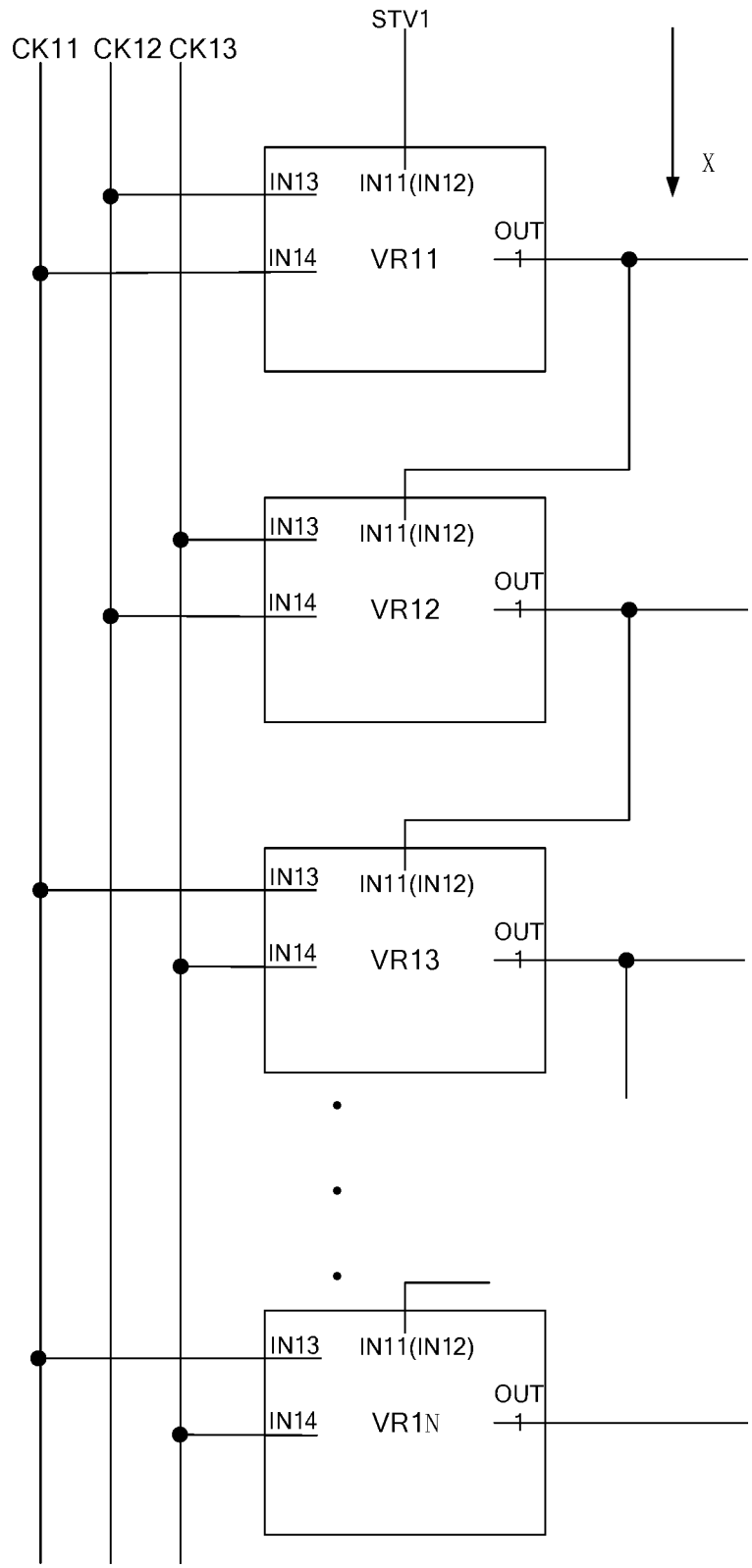
FIG. 2 illustrates a schematic diagram of cascaded shift registers of an exemplary display panel consistent with disclosed embodiments of the present disclosure.

The present disclosure provides a display panel. Referring to FIG. 1, the display panel may include at least one driving circuit 10 and at least one pixel circuit 20. The driving circuit 10 may provide a driving signal for the pixel circuit 20. The driving circuit 10 may be disposed in a frame region 100 of the display panel, and may include N-level shift registers cascaded with each other, where N≥2. Referring to FIG. 2, the driving circuit may include N-level shift registers VR11-VR1N. The pixel circuit 20 may be located in a display region 200 of the display panel, and may provide a display signal for a display unit 30 of the display panel.

Figure 3:
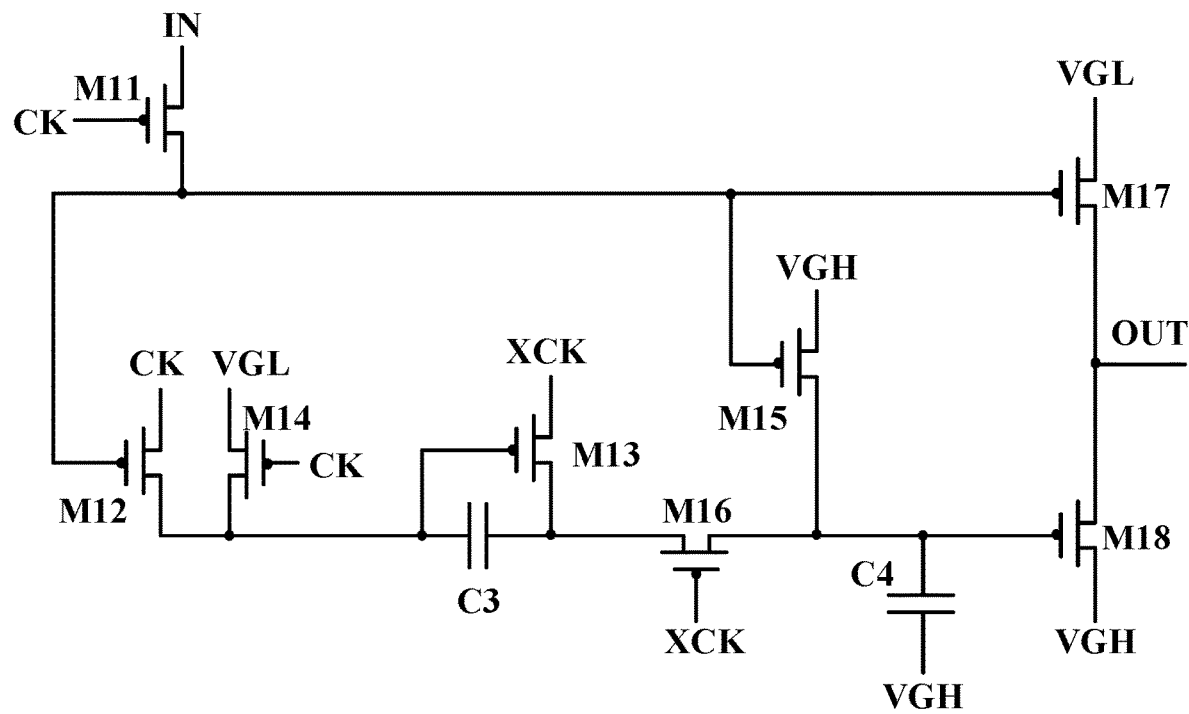
FIG. 3 illustrates a schematic circuit diagram of a shift register of an exemplary display panel consistent with disclosed embodiments of the present disclosure.
Figure 4:
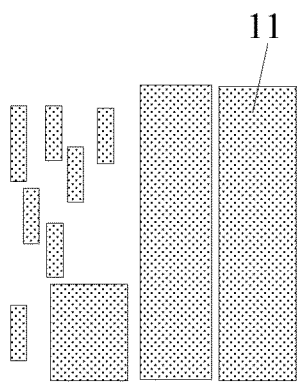
FIG. 4 illustrates a schematic local top-view of at least one first active layer of an exemplary display panel consistent with disclosed embodiments of the present disclosure.
Figure 5:
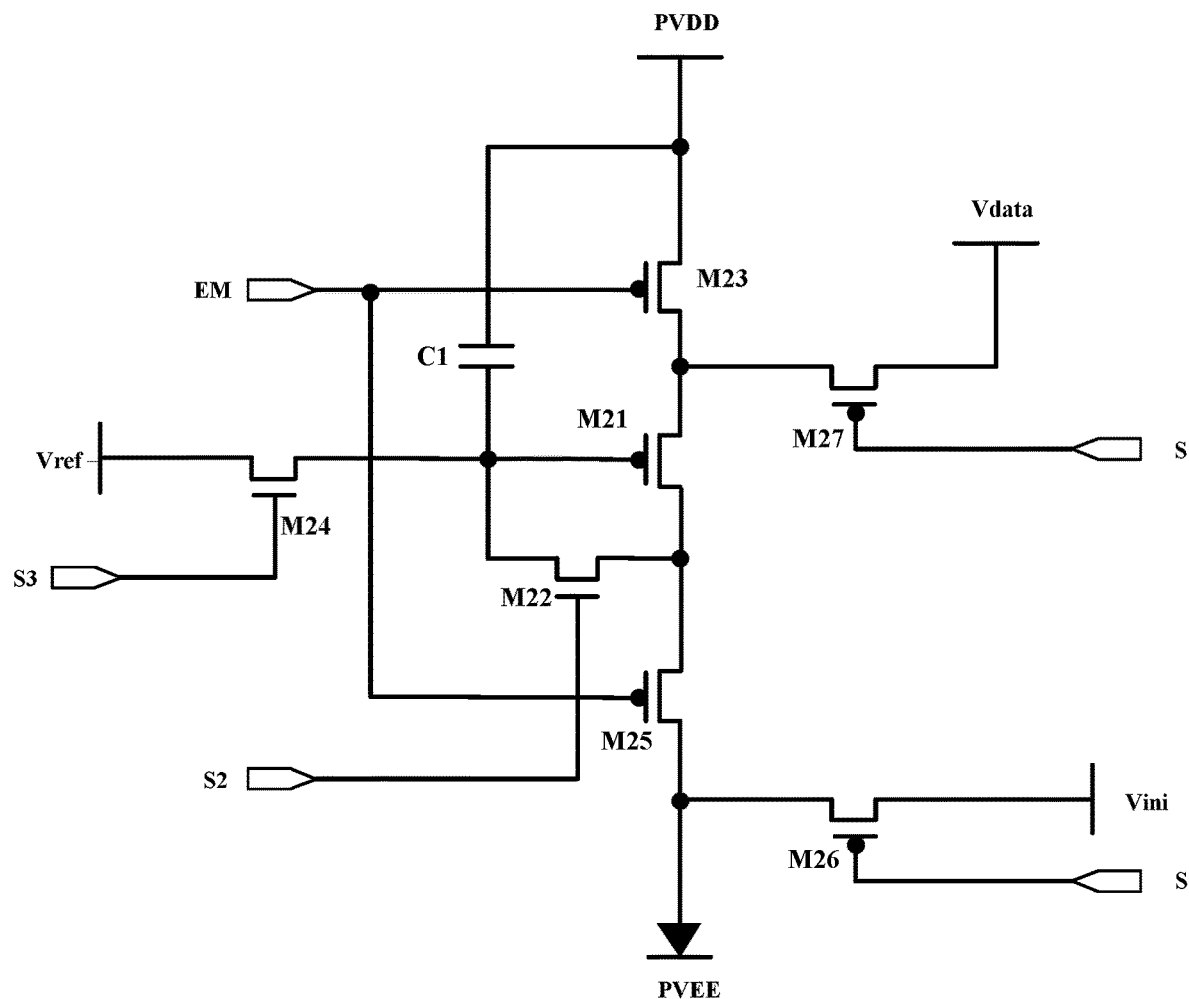
FIG. 5 illustrates a schematic diagram of a pixel circuit of an exemplary display panel consistent with disclosed embodiments of the present disclosure.
Figure 6:
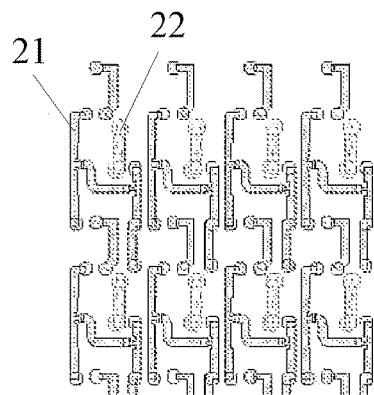
FIG. 6 illustrates a schematic local top-view of at least one second active layer of an exemplary display panel consistent with disclosed embodiments of the present disclosure.

Specifically, in disclosed embodiments of the present disclosure, a shift register of the N cascaded shift registers may include at least one first transistor, e.g., M11-M18 shown in FIG. 3. Referring to FIG. 4, the at least one first transistor may include at least one first active layer, and an active layer with a largest area among the at least one first active layer may be a first preset active layer 11. The pixel circuit may include at least one second transistor, e.g., M21-M27 shown in FIG. 5. Referring to FIG. 6, the at least one second transistor may include at least one second active layer, and an active layer with a largest area among active layers containing silicon of the at least one second active layer may be a second preset active layer 21, and an active layer with a largest area among active layers containing oxide semiconductor of the at least one second active layer may be a third preset active layer 22.

It should be noted that in the disclosed embodiments of the present disclosure, the first active layer may be an active layer corresponding to one first transistor, or may be an active layer corresponding to at least two first transistors connected in series. Similarly, the second active layer may be an active layer corresponding to one second transistor, or may be an active layer corresponding to at least two second transistors connected in series, which may not be limited by the present disclosure and may be determined by practical applications.

It should be noted that in the disclosed embodiments of the present disclosure, the first transistor may have a transistor structure with a single channel region. In other words, the first transistor may include one channel region. In another embodiment, the first transistor may have a transistor structure with multiple channel regions. In other words, the first transistor may include multiple channel regions. Similarly, the second transistor may have a transistor structure with a single channel region. In other words, the second transistor may include one channel region. In another embodiment, the second transistor may have a transistor structure multiple channel regions. In other words, the second transistor may include multiple channel regions, which may not be limited by the present disclosure.

The static charges in the display region of the display panel may be transferred from the frame region, while the driving circuit including the multi-level shift registers may be an important electrical element in the frame region of the display panel, and may include at least one first transistor. The active layer in the transistor may often contain polysilicon or oxide semiconductor, which may have a substantially large resistance compared with other structures in the frame region. Moreover, the greater the area of the active layer of the transistor, the greater the resistance, and the better the effect of resisting static charges.

Figure 7:
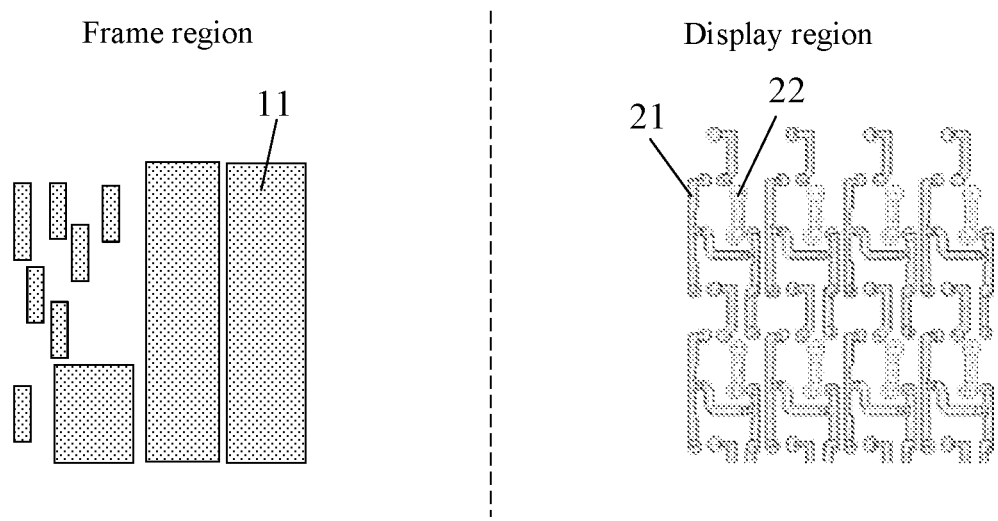
FIG. 7 illustrates a schematic diagram of a first preset active layer, a second preset active layer, and a third preset active layer of an exemplary display panel consistent with disclosed embodiments of the present disclosure.

Therefore, in the disclosed display panel, referring to FIG. 7, the area of the first preset active layer 11 may be greater than the area of the second preset active layer 21, and the area of the first preset active layer 11 may be greater than the area of the third preset active layer 22. By increasing the area of the first preset active layer located in the shift register, the resistance of the first preset active layer located in the frame region may increase, thereby increasing the blocking effect of the first preset active layer against static charges, reducing the probability of static charges in the frame region of the display panel being transferred to the display region, further reducing the probability of the display region of the display panel being damaged by static charges, and improving the quality of the display panel.

It should be noted that with the development of display technology, the requirements for the resolution of the display panel may be getting higher and higher, such that a quantity of display units disposed in the display region of the display panel may increase, and the layout space for arranging pixel circuits corresponding to each display unit may be getting smaller and smaller. Therefore, in the disclosed display panel, by increasing the area of the first preset active layer located in the frame region, the probability of the static charges in the frame region being transferred to the display region and causing damages to the display region may be reduced, which may not only improve the quality of the display panel, but also may not increase the difficulty of disposing the transistors in the pixel circuit, thereby facilitating the development of display panel towards high display density.

It should be noted that in the disclosed embodiments, the shift register may include one first transistor, or may include a plurality of first transistors. Similarly, the pixel circuit may include one second transistor, or may include a plurality of second transistors, which may not be limited by the present disclosure and may be determined by practical applications. For illustrative purposes, the shift register may include the plurality of first transistors and the pixel circuit may include the plurality of second transistors as an example.

Optionally, on the basis of the foregoing embodiments, in one embodiment, the first transistor may be a polysilicon transistor. In other words, the active layer of the first transistor may contain polysilicon. In another embodiment, the first transistor may be an oxide semiconductor transistor. In other words, the active layer of the first transistor may contain oxide semiconductor, which may not be limited by the present disclosure and may be determined by practical applications.

It should be noted that in the above embodiments, when the first transistor in the shift register is a polysilicon transistor, the first preset active layer may be an active layer with the largest area among the active layers containing silicon of the at least one first active layer. When the first transistor in the shift register is an oxide semiconductor transistor, the first preset active layer may be an active layer with the largest area among the active layers containing oxide semiconductor of the at least one first active layer.

On the basis of any of the foregoing embodiments, in one embodiment, entire second transistors in the pixel circuit may be polysilicon transistors. In another embodiment, entire second transistors in the pixel circuit may be oxide semiconductor transistors. In certain embodiments, part of the second transistors may be polysilicon transistors, and another part of the second transistors may be oxide semiconductor transistors, which may not be limited be the present disclosure and may be determined by practical applications.

Optionally, on the basis of any of the foregoing embodiments, in one embodiment, the polysilicon transistor may be a low temperature poly-silicon (LTPS) transistor, and the oxide semiconductor transistor may be an indium gallium zinc oxide (IGZO) transistor, which may not be limited be the present disclosure and may be determined by practical applications.

It should be noted that when the second transistor in the pixel circuit is a polysilicon transistor, the area of the first preset active layer may be greater than the area of the second preset active layer. Therefore, through configuring the area of the active layer with the largest area among the at least one first active layer in the shift register to be greater than the area of the active layer with the largest area among the at least one second active layer in the pixel circuit, the resistance of the first preset active layer located in the frame region may increase, thereby improving the blocking effect of the first preset active layer against static charges, reducing the probability of static charges in the frame region of the display panel being transferred to the display region, further reducing the probability of the display region of the display panel being damaged by static charges, and improving the quality of the display panel.

When the second transistor in the pixel circuit is an oxide semiconductor transistor, the area of the first preset active layer may be greater than the area of the third preset active layer. Therefore, through configuring the area of the active layer with the largest area among the at least one first active layer in the shift register to be greater than the area of the active layer with the largest area among the at least one second active layer in the pixel circuit, the resistance of the first preset active layer may increase, thereby improving the blocking effect of the first preset active layer against static charges, reducing the probability of static charges in the frame region of the display panel being transferred to the display region, further reducing the probability of the display region of the display panel being damaged by static charges, and improving the quality of the display panel.

When part of the second transistors in the pixel circuits are polysilicon transistors and part of the second transistors are oxide semiconductor transistors, the area of the first preset active layer may be greater than the area of the second preset active layer and greater than the area of the third preset active layer. Through configuring the area of the active layer with the largest area of the at least one first active layer in the shift register to be greater than the area of the active layer with the largest area among the active layers containing silicon of the at least one second active layer in the pixel circuit and greater than the area of the active layer with the largest area among the active layers containing oxide semiconductor of the at least one second active layer, the resistance of the first preset active layer located in the frame region may increase, thereby improving the blocking effect of the first preset active layer against static charges, reducing the probability of static charges in the frame region of the display panel being transferred to the display region, further reducing the probability of the display region of the display panel being damaged by static charges, and improving the quality of the display panel.

Optionally, in one embodiment, when the second transistors in the pixel circuit include both a polysilicon transistor and an oxide semiconductor transistor, the area of the first preset active layer may be greater than a sum of the area of the second preset active layer and the area of the third preset active layer, to further increase the area of the first preset active layer and improve the antistatic capability of the first preset active layer, to ensure that the region where the shift register is located may have sufficient antistatic capability, which may not be limited be the present disclosure and may be determined by practical applications.

It should be noted that in one embodiment, the shift register may be located in a region where a gate driving circuit is located in the frame region, and the region where the gate driving circuit is located may have a substantially large space. Therefore, in the present disclosure, through configuring the area of the first preset active layer in the shift register to be greater than the sum of the area of the second preset active layer and the area of the third preset active layer, to enable the region where the shift register is located to have sufficient antistatic capability, which may further reduce the probability of the display region of the display panel being damaged by static charges.

Figure 8:
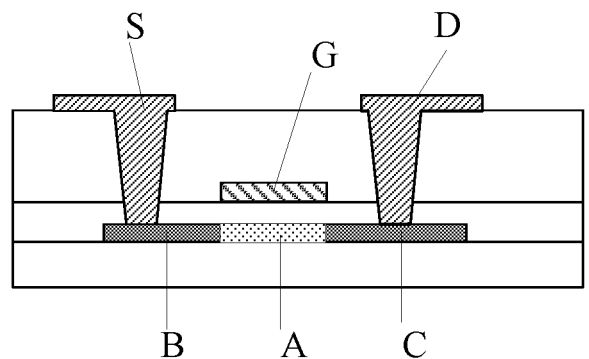
FIG. 8 illustrates a cross-sectional view of a transistor of an exemplary display panel consistent with disclosed embodiments of the present disclosure.
Figure 9:
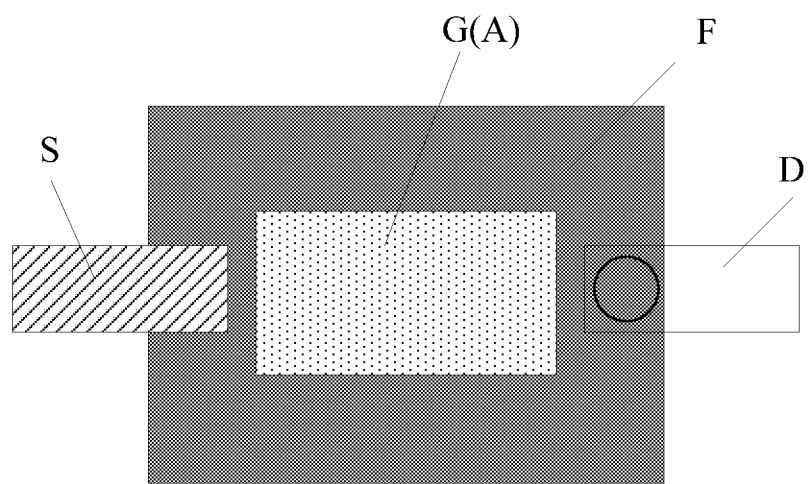
FIG. 9 illustrates a schematic top-view of a transistor in FIG. 8 consistent with disclosed embodiments of the present disclosure.

FIG. 8 illustrates a cross-sectional view of the transistor, and FIG. 9 illustrates a top-view of the transistor. Referring to FIG. 8 and FIG. 9, the transistor may include a gate G, a source S, a drain D and an active layer. The active layer may include a channel region A overlapped with the gate G, a source region B electrically connected to the source S, and a drain region C electrically connected to the drain D. For ease of description, the region overlapped with the gate G in the active layer may be referred to as the channel region A, and the portion of the active layer except for the channel region A may be collectively referred to as a non-channel region F.

Specifically, in one embodiment, the area of the first preset active layer may be SA1, the area of the second preset active layer may be SA2, and the area of the third preset active layer may be SA3. In one embodiment, the area of the first preset active layer may be greater than the area of the second preset active layer, and the area of the first preset active layer may be greater than the area of the third preset active layer, i.e., SA1>SA2 and SA1>SA3. A sum of areas of channel regions of at least one first transistor corresponding to the first preset active layer may be SC1, a sum of areas of channel regions of at least one second transistor corresponding to the second preset active layer may be SC2, and a sum of areas of channel regions of at least one second transistor corresponding to the third preset active layer may be SC3.

It should be noted that no matter the first preset active layer corresponds to a plurality of first transistors, or at least one first transistor corresponding to the first preset active layer has a plurality of channel regions, or the first preset active layer corresponds to a plurality of first transistors and at least one first transistor corresponding to the first preset active layer has a plurality of channel regions, the sum of the areas of the channel regions of the at least one first transistor corresponding to the first preset active layer may be the sum of the area of each channel region of the at least one first transistor corresponding to the first preset active layer.

Similarly, no matter the second preset active layer corresponds to a plurality of second transistors, or at least one second transistor corresponding to the second preset active layer has a plurality of channel regions, or the second preset active layer corresponds to a plurality of second transistors and at least one second transistor corresponding to the second preset active layer has a plurality of channel regions, the sum of the areas of the channel regions of the at least one second transistor corresponding to the second preset active layer may be the sum of the area of each channel region of the at least one second transistor corresponding to the second preset active layer.

Similarly, whether the third preset active layer corresponds to a plurality of second transistors, or the at least one second transistor corresponding to the third preset active layer has a plurality of channel regions, or the third preset active layer corresponds to a plurality of second transistors and at least one second transistor corresponding to the third preset active layer has a plurality of channel regions, the sum of the areas of the channel regions of the at least one second transistor corresponding to the third preset active layer may be the sum of the area of each channel region of the at least one second transistor corresponding to the third preset active layer.

It should be noted that in practical applications, an aspect ratio of the channel region of the active layer of the transistor may be a key feature that affects the performance of the transistor. For a transistor with specific performance, the aspect ratio may be a fixed value. When the aspect ratio of the channel region of the active layer of the transistor changes, the performance of the transistor may also change. When the area of the channel region of the transistor is fixed, the greater the area of the non-channel region of the transistor, the longer it takes to transmit a signal in the transistor.

With the development of display technology, the demands on the quality of displaying picture may become higher and higher. The pixel circuit may be configured to control the display state of the display unit in the display panel, the increase of time period for transmitting the signal in each transistor of the pixel circuit may directly increase the delay of the display picture and affect the display effect.

Therefore, in one embodiment, by increasing the area of the non-channel region of the first preset active layer and without changing the area of the channel region of the first preset active layer as well as the area of the second preset active layer and the area of the third preset active layer, the area of the first preset active layer may be greater than the area of the second preset active layer and the area of the third preset active layer. Therefore, without changing the aspect ratios of the first transistor and the second transistor and without increasing the delay of the display picture of the display panel, the blocking effect of the frame region of the display panel against static charges may increase, and the probability of the display region of the display panel being damaged caused by static charges in the frame region of the display panel being transferred to the display region may be reduced.

Specifically, in one embodiment, the area of the non-channel region of the first preset active layer may be greater than the area of the non-channel region of the second preset active layer, i.e., $SA1-SC1>SA2-SC2$. By increasing the area of the non-channel region of the first preset active layer, the area of the first preset active layer may increase, such that the area of the first preset active layer may be greater than the area of the second preset active layer, i.e., SA1>SA2. Therefore, without changing the aspect ratio of the channel region of the first transistor corresponding to the first preset active layer, the antistatic capability of the first preset active layer may increase, and the probability of the display region of the display panel being damaged caused by static charges in the frame region of the display panel being transferred to the display region may be reduced.

In certain embodiments, the area of the channel region of the first preset active layer may be set to be greater than the area of the channel region of the second preset active layer, i.e., SC1>SC2, such that the area of the first preset active layer may be greater than the area of the second preset active layer. Alternatively, the area of the channel region and the area of the non-channel region of the first preset active layer may be greater than the area of the channel region and the area of the non-channel region of the second preset active layer, respectively, such that the area of the first preset active layer may be greater than the area of the second preset active layer, which may not be limited by the present disclosure and may be determined by practical applications.

In another embodiment, the area of the non-channel region of the first preset active layer may be greater than the area of the non-channel region of the third preset active layer, i.e., SA1−SC1>SA3−SC3. By increasing the area of the non-channel region of the first preset active layer, the area of the first preset active layer may increase, such that the area of the first preset active layer may be greater than the area of the third preset active layer, i.e., SA1>SA3. Therefore, without changing the aspect ratio of the channel region of the first transistor corresponding to the first preset active layer, the antistatic capability of the first transistor may increase, and the probability of the display region of the display panel being damaged caused by static charges in the frame region of the display panel being transferred to the display region may be reduced.

In certain embodiments, the area of the channel region of the first preset active layer may be set to be greater than the area of the channel region of the third preset active layer, i.e., SC1>SC3, such that the area of the first preset active layer may be greater than the area of the third preset active layer. Alternatively, the area of the channel region and the area of the non-channel region of the first preset active layer may be greater than the area of the channel region and the area of the non-channel region of the third preset active layer, respectively, such that the area of the first preset active layer may be greater than the area of the third preset active layer, which may not be limited by the present disclosure and may be determined by practical applications.

In another embodiment, the area of the non-channel region of the first preset active layer may be greater than the area of the non-channel region of the second preset active layer, i.e., SA1−SC1>SA2−SC2, and the area of the non-channel region of the first preset active layer may be greater than the area of the non-channel region of the third preset active layer, i.e., SA1−SC1>SA3−SC3. By increasing the area of the non-channel region of the first preset active layer, the area of the first preset active layer may increase, such that the area of the first preset active layer may be greater than the area of the second preset active layer and the area of the third preset active layer, i.e., SA1>SA2 and SA1>SA3. Therefore, without changing the aspect ratio of the channel region of the first transistor corresponding to the first preset active layer, the antistatic capability of the first transistor may increase, and the probability of the display region of the display panel being damaged caused by static charges in the frame region of the display panel being transferred to the display region may be reduced.

In certain embodiments, the area of the channel region of the first preset active layer may be set to be greater than the area of the channel region of the second preset active layer, and the area of the non-channel region of the first preset active layer may be set to be greater than the area of the non-channel region of the third preset active layer, such that the area of the first preset active layer may be greater than the area of the second preset active layer, and the area of the first preset active layer may be greater than the area of the third preset active layer.

Alternatively, the area of the non-channel region of the first preset active layer may be greater than the area of the non-channel region of the second preset active layer, and the area of the channel region of the first preset active layer may be greater than the area of the channel region of the third preset active layer, such that the area of the first preset active layer may be greater than the area of the second preset active layer, and the area of the first preset active layer may be greater than the area of the third preset active layer.

Alternatively, the area of the channel region of the first preset active layer may be set to be greater than the area of the channel region of the second preset active layer, and the area of the channel region of the first preset active layer may be set to be greater than the area of the channel region of the third preset active layer, such that the area of the first preset active layer may be greater than the area of the second preset active layer, and the area of the first preset active layer may be greater than the area of the third preset active layer, which may not be limited by the present disclosure and may be determined by practical applications.

Optionally, in one embodiment, the area of the non-channel region of the first preset active layer may be greater than a sum of the area of the non-channel region of the second preset active layer and the area of the non-channel region of the third preset active layer, i.e., SA1−SC1>(SA2−SC2)+(SA3−SC3). Therefore, without changing the aspect ratio of the channel region of the first transistor corresponding to the first preset active layer, the region where the shift register is located may have sufficient antistatic capability, which may further reduce the probability of the display region of the display panel being damaged caused by static charges.

It should be noted that in any of the foregoing embodiments, when one shift register includes a plurality of first transistors, the entire first transistors may be polysilicon transistors, or the entire second transistors may be oxide semiconductor transistors. In another embodiment, the plurality of first transistors may not only include polysilicon transistors, but also include oxide semiconductor transistors. In other words, part of the first transistors may be polysilicon transistors, and another part of the first transistors may be oxide semiconductor transistors.

On the basis of the foregoing embodiments, in one embodiment, when the plurality of first transistors include both polysilicon transistors and oxide semiconductor transistors, the shift register may further include a fourth preset active layer. In other words, the at least one first active layer may further include the fourth preset active layer. Specifically, when the first preset active layer is an active layer containing silicon, the fourth preset active layer may be an active layer with the largest area among active layers containing oxide semiconductor in the at least one first active layer. When the first preset active layer is an active layer containing oxide semiconductor, the fourth preset active layer may be an active layer with the largest area among the active layers containing silicon in the at least one first active layer.

On the basis of the foregoing embodiments, in one embodiment, a sum of the area of the first preset active layer and the area of the fourth preset active layer may be greater than a sum of the area of the second preset active layer and the area of the third preset active layer. By increasing the overall area of the first preset active layer and the fourth preset active layer in the frame region, the antistatic capability of the frame region of the display panel may increase, and the probability of the display region of the display panel being damaged caused by static charges in the frame region of the display panel being transferred to the display region may be reduced.

Optionally, in one embodiment, the area of the fourth preset active layer may be greater than the area of the second preset active layer and/or the area of the third preset active layer. By increasing the area of the fourth preset active layer, the antistatic capability of the frame region of the display panel may increase, which may not be limited by the present disclosure. In another embodiment, the area of the fourth preset active layer may be smaller than the area of the second preset active layer and/or the area of the third preset active layer, as long as the sum of the area of the first preset active layer and the area of the fourth preset active layer is greater than the sum of the area of the second preset active layer and the area of the third preset active layer.

It should be noted that in practical applications, an aspect ratio of the channel region of the active layer of the transistor may be a key feature that affects the performance of the transistor. For a transistor with specific performance, the aspect ratio may be a fixed value. When the area of the channel region of the transistor is fixed, the greater the area of the non-channel region of the transistor, the longer it takes to transmit a signal in the transistor.

Therefore, in one embodiment, a sum of a total area of the non-channel regions of the at least one first transistor corresponding to the first preset active layer and a total area of the non-channel regions of the at least one first transistor corresponding to the fourth preset active layer may be greater than a sum of a total area of the non-channel regions of the at least one second transistor corresponding to the second preset active layer and a total area of the non-channel regions of the at least one second transistor corresponding to the third preset active layer. Therefore, without increasing the aspect ratio of the channel region of the first transistor corresponding to the first preset active layer and the aspect ratio of the channel region of the first transistor corresponding to the fourth preset active layer, the antistatic capability of the frame region may increase, and the probability of the display region being damaged caused by static charges in the frame region being transferred to the display region may be reduced without increasing the delay of the display picture of the display panel.

Specifically, the area of the first preset active layer may be SA1, the area of the second active layer may be SA2, the area of the third active layer may be SA3, and the area of the fourth preset active layer may be SA4. The total area of the channel regions of at least one first transistor corresponding to the first preset active layer may be SC1, the total area of the channel regions of at least one second transistor corresponding to the second preset active layer may be SC2, the total area of the channel regions of the at least one second transistor corresponding to the third preset active layer may be SC3, and the total area of the channel regions of at least one first transistor corresponding to the fourth preset active layer may be SC4. Therefore, (SA1−SC1)+(SA4−SC4)>(SA2−SC2)+(SA3−SC3). Without increasing the aspect ratio of the channel region of the first transistor corresponding to the first preset active layer and the aspect ratio of the channel region of the first transistor corresponding to the fourth preset active layer, the antistatic capability of the frame region may increase, and the probability of the display region being damaged caused by static charges in the frame region being transferred to the display region may be reduced without increasing the delay of the display picture of the display panel.

In certain embodiments, the area of the channel region of the first preset active layer may be appropriately increased and/or the area of the channel region of the fourth preset active layer may be appropriately increased. Without changing the aspect ratio of the channel region of the first transistor corresponding to the first preset active layer and the aspect ratio of the channel region of the first transistor corresponding to the fourth preset active layer, the antistatic capability of the first preset active layer and the fourth preset active layer may increase, thereby increasing the antistatic capability of the frame region of the display panel.

An implementation manner of the sum of the total area of the non-channel regions of the at least one first transistor corresponding to the first preset active layer and the total area of the non-channel regions of the at least one first transistor corresponding to the fourth preset active layer being greater than the sum of the total area of the non-channel regions of the at least one second transistor corresponding to the second preset active layer and the total area of the non-channel regions of the at least one second transistor corresponding to the third preset active layer, i.e., (SA1−SC1)+(SA4−SC4)>(SA2−SC2)+(SA3−SC3), may be described in detail below in conjunction with specific embodiments.

Specifically, in one embodiment, the first preset active layer may contain silicon, and the fourth preset active layer may contain oxide semiconductor.

On the basis of the foregoing embodiments, in one embodiment, the total area of the non-channel regions of the at least one first transistor corresponding to the first preset active layer may be greater than the total area of the non-channel regions of the at least one second transistor corresponding to the second preset active layer, i.e., SA1−SC1>SA2−SC2, such that (SA1−SC1)+(SA4−SC4)>(SA2−SC2)+(SA3−SC3). Therefore, by increasing the total area of the non-channel regions of the at least one first transistor corresponding to the first preset active layer, the antistatic capability of the frame region of the display panel may increase, and the probability of the display region of the display panel being damaged caused by static charges in the frame region of the display panel being transferred to the display region may be reduced.

In another embodiment, the total area of the non-channel regions of the at least one first transistor corresponding to the fourth preset active layer may be greater than the total area of the non-channel regions of the at least one second transistor corresponding to the third preset active layer, i.e., SA4−SC4>SA3−SC3, such that (SA1−SC1)+(SA4−SC4)>(SA2−SC2)+(SA3−SC3). Therefore, by increasing the total area of the non-channel regions of the at least one first transistor corresponding to the fourth preset active layer, the antistatic capability of the frame region of the display panel may increase, and the probability of the display region of the display panel being damaged caused by static charges in the frame region of the display panel being transferred to the display region may be reduced.

In another embodiment, the total area of the non-channel regions of the at least one first transistor corresponding to the first preset active layer may be greater than the total area of the non-channel regions of the at least one second transistor corresponding to the second preset active layer, and the total area of the non-channel regions of the at least one first transistor corresponding to the fourth preset active layer may be greater than the total area of the non-channel regions of the at least one second transistor corresponding to the third preset active layer, i.e., SA1−SC1>SA2−SC2 and SA4−SC4>SA3−SC3, such that (SA1−SC1)+(SA4−SC4)>(SA2−SC2)+(SA3−SC3). Therefore, by simultaneously increasing the total area of the non-channel regions of the at least one first transistor corresponding to the first preset active layer and the total area of the non-channel regions of the at least one first transistor corresponding to the fourth preset active layer, the antistatic capability of the frame region of the display panel may increase, and the probability of the display region of the display panel being damaged caused by static charges in the frame region of the display panel being transferred to the display region may be reduced.

It should be noted that in the above-disclosed implementation manners, the implementation manner of (SA1−SC1)+(SA4−SC4)>(SA2−SC2)+(SA3−SC3) may be describe using the first preset active layer containing silicon, and the fourth preset active layer containing oxide semiconductor as an example, which may not be limited by the present disclosure. In certain embodiments, the first preset active layer main contain oxide semiconductor, and the fourth preset active layer may contain silicon.

When the first preset active layer contains oxide semiconductor and the fourth preset active layer contains silicon, the implementation manner of (SA1−SC1)+(SA4−SC4)>(SA2−SC2)+(SA3−SC3) may be described in detail below in conjunction with specific embodiments.

In one embodiment, the total area of the non-channel regions of the at least one first transistor corresponding to the fourth preset active layer may be greater than the total area of the non-channel regions of the second transistor corresponding to the second preset active layer, i.e., SA4−SC4>SA2−SC2, such that (SA1−SC1)+(SA4−SC4)>(SA2−SC2)+(SA3−SC3). Therefore, by increasing the total area of the non-channel regions of the at least one first transistor corresponding to the fourth preset active layer, the antistatic capability of the frame region of the display panel may increase, and the probability of the display region of the display panel being damaged caused by static charges in the frame region of the display panel being transferred to the display region may be reduced.

In another embodiment, the total area of the non-channel regions of the at least one first transistor corresponding to the first preset active layer may be greater than the total area of the non-channel regions of the at least one second transistor corresponding to the third preset active layer, i.e., SA1−SC1>SA3−SC3, such that (SA1−SC1)+(SA4−SC4)>(SA2−SC2)+(SA3−SC3). Therefore, by increasing the total area of the non-channel regions of the at least one first transistor corresponding to the first preset active layer, the antistatic capability of the frame region of the display panel may increase, and the probability of the display region of the display panel being damaged caused by static charges in the frame region of the display panel being transferred to the display region may be reduced.

In another embodiment, the total area of the non-channel regions of the at least one first transistor corresponding to the fourth preset active layer may be greater than the total area of the non-channel regions of the at least one second transistor corresponding to the second preset active layer, and the total area of the non-channel regions of the at least one first transistor corresponding to the first preset active layer may be greater than the total area of the non-channel regions of the at least one second transistor corresponding to the third preset active layer, i.e., SA4−SC4>SA2−SC2 and SA1−SC1>SA3−SC3, such that (SA1−SC1)+(SA4−SC4)>(SA2-SC2)+(SA3−SC3). Therefore, by simultaneously increasing the total area of the non-channel regions of the at least one first transistor corresponding to the fourth preset active layer and the total area of the non-channel regions of the at least one first transistor corresponding to the first preset active layer, the antistatic capability of the frame region of the display panel may increase, and the probability of the display region of the display panel being damaged caused by static charges in the frame region of the display panel being transferred to the display region may be reduced.

On the basis of any of the foregoing embodiments, in one embodiment, the shift register may further include a fifth preset active layer. In other words, the at least one first active layer may further include the fifth preset active layer.

Figure 10:
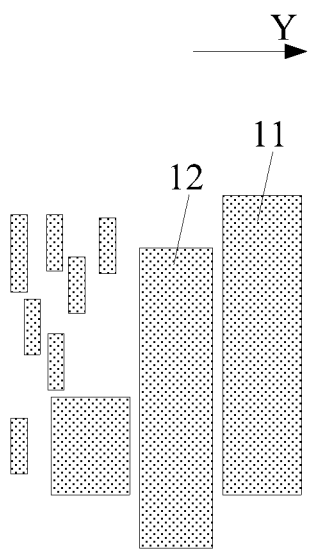
FIG. 10 illustrates a schematic local top-view of at least one first active layer of another exemplary display panel consistent with disclosed embodiments of the present disclosure.

Referring to FIG. 10, the fifth preset active layer 12 may be an active layer having an area only smaller than the first preset active layer 11 among the at least one first active layer. The area of the fifth preset active layer may be greater than the area of the second preset active layer, and the area of the fifth preset active layer may be greater than the area of the third preset active layer. The resistance of the fifth preset active layer may increase by increasing the area of the fifth preset active layer, thereby increasing the blocking effect of the fifth preset active layer against static charges. On the basis of improving the antistatic capability of the frame region of the display panel by increasing the area of the first preset active layer, by further increasing the area of the fifth preset active layer, the antistatic capability of the frame region of the display panel may increase, the probability of static charges in the frame region of the display panel being transferred to the display region may be reduced, the probability of the display region of the display panel being damaged by static charges may be reduced, and the quality of the display panel may be improved.

Optionally, in one embodiment, the area of the fifth preset active layer may be greater than a sum of the area of the second preset active layer and the area of the third preset active layer. By increasing the area of the fifth preset active layer, the antistatic capability of the fifth preset active layer may increase, to ensure that the region where the shift register is located may have sufficient antistatic capability, which may not be limited be the present disclosure and may be determined by practical applications.

It should be noted that in practical applications, an aspect ratio of the channel region of the active layer of the transistor may be a key feature that affects the performance of the transistor. For a transistor with specific performance, the aspect ratio may be a fixed value. When the area of the channel region of the transistor is fixed, the greater the area of the non-channel region of the transistor, the longer it takes to transmit a signal in the transistor.

Therefore, in one embodiment, by increasing the area of the non-channel region of the fifth preset active layer and without changing the area of the channel region of the fifth preset active layer, the area of the second preset active layer and the area of the third preset active layer, the area of the fifth preset active layer may be greater than the sum of the area of the second preset active layer and the area of the third preset active layer. Therefore, without changing the aspect ratios of the first transistor and the second transistor and without increasing the delay of the display picture of the display panel, the antistatic capability of the frame region of the display panel may increase, and the probability of the display region being damaged caused by static charges in the frame region being transferred to the display region may be reduced.

Specifically, the area of the fifth preset active layer may be SA5, and a sum of areas of channel regions of at least one first transistor corresponding to the fifth preset active layer may be SC5. In one embodiment, the area of the non-channel region of the fifth preset active layer may be greater than the area of the non-channel region of the second preset active layer, i.e., SA5−SC5>SA2−SC2. By increasing the area of the non-channel region of the fifth preset active layer, the area of the fifth preset active layer may increase, such that the area of the fifth preset active layer may be greater than the area of the second preset active layer, i.e., SA5>SA2. Therefore, without changing the aspect ratio of the channel region of the first transistor corresponding to the fifth preset active layer, the antistatic capability of the fifth preset active layer may increase, and the probability of the display region being damaged caused by static charges in the frame region being transferred to the display region may be reduced.

In another embodiment, the area of the non-channel region of the fifth preset active layer may be greater than the area of the non-channel region of the third preset active layer, i.e., SA5−SC5>SA3−SC3. By increasing the area of the non-channel region of the fifth preset active layer, the area of the fifth preset active layer may increase, such that the area of the fifth preset active layer may be greater than the area of the third preset active layer, i.e., SA5>SA3. Therefore, without changing the aspect ratio of the channel region of the first transistor corresponding to the fifth preset active layer, the antistatic capability of the first transistor may increase, and the probability of the display region being damaged caused by static charges in the frame region being transferred to the display region may be reduced.

In another embodiment, the area of the non-channel region of the fifth preset active layer may be greater than the area of the non-channel region of the second preset active layer, and the area of the non-channel region of the fifth preset active layer may be greater than the area of the non-channel region of the third preset active layer, i.e., SA5−SC5>SA2−SC2 and SA5−SC5>SA3−SC3. By increasing the area of the non-channel region of the fifth preset active layer, the area of the fifth preset active layer may increase, such that the area of the fifth preset active layer may be greater than the area of the second preset active layer and the area of the third preset active layer, i.e., SA5>SA2 and SA5>SA3. Therefore, without changing the aspect ratio of the channel region of the first transistor corresponding to the fifth preset active layer, the antistatic capability of the first transistor may increase, and the probability of the display region being damaged caused by static charges in the frame region being transferred to the display region may be reduced.

Optionally, on the basis of the foregoing embodiments, in one embodiment, the area of the non-channel region of the fifth preset active layer may be greater than a sum of the area of the non-channel region of the second preset active layer and the area of the non-channel region of the third preset active layer, i.e., SA5−SC5>(SA2−SC2)+(SA3−SC3). Therefore, without changing the aspect ratio of the channel region of the first transistor corresponding to the fifth preset active layer, the region where the shift register is located may have sufficient antistatic capability, which may further reduce the probability of the display region of the display panel being damaged caused by static charges.

On the basis of any of the foregoing embodiments, in one embodiment, referring to FIG. 1 and FIG. 2, the cascaded shift registers may be extended along a first direction X, and the shift register may provide a driving signal to the pixel circuit 30 located in the display region 200 of the display panel along a second direction Y. The first direction X may be perpendicular to the second direction Y. Referring to FIG. 10, using the second direction Y as a projection direction, at least a portion of the first preset active layer 11 may not overlap the fifth preset active layer 12, to increase the projection of the at least one first active layer on the second direction Y. Therefore, when the static charges in the frame region of the display panel are transferred to the display region of the display panel, the blocking area of the at least one first active layer against static charges in the frame region of the display panel may increase, which may further reduce the probability of static charges in the frame region of the display panel being transferred to the display region of the display panel.

Optionally, in one embodiment, using the second direction as the projection direction, the first preset active layer and the fifth preset active layer may not overlap at all, to increase the projection of the at least one first active layer on the second direction as much as possible. Therefore, when the static charges in the frame region of the display panel are transferred to the display region of the display panel, the blocking area of the at least one first active layer against static charges in the frame region of the display panel may increase, which may further reduce the probability of static charges in the frame region of the display panel being transferred to the display region of the display panel.

On the basis of any of the foregoing embodiments, in one embodiment, the pixel circuit may include a driving transistor and a switching transistor. The second preset active layer may be an active layer corresponding to the driving transistor of the pixel circuit, and the third preset active layer may be an active layer corresponding to the switching transistor of the pixel circuit. Therefore, the second preset active layer and the third preset active layer may be active layers corresponding to transistors with different functions in the pixel circuit, respectively. The pixel circuit shown in FIG. 5 may be used as an example, the second transistor M21 in the pixel circuit may be the driving transistor, and the second transistors M22-M27 may be switching transistors.

On the basis of the above-disclosed embodiments, in one embodiment, the area of the second preset active layer may be greater than the area of the third preset active layer. By increasing the area of the second preset active layer in the display region of the display panel, the antistatic capability of the display region of the display panel may be improved, and the probability of the display region of the display panel being damaged by static charges may be reduced.

It should be noted that in practical applications, an aspect ratio of the channel region of the active layer of the transistor may be a key feature that affects the performance of the transistor. For a transistor with specific performance, the aspect ratio may be a fixed value. Therefore, in one embodiment, the area of the non-channel region of the at least one second transistor corresponding to the second preset active layer may be greater than the area of the non-channel region of the at least one second transistor corresponding to the third preset active layer. Therefore, without changing the aspect ratio of the channel region of the at least one second transistor corresponding to the second preset active layer, the antistatic capability of the second preset active layer may increase, and the probability of the display region of the display panel being damaged by static charges may be reduced.

Specifically, in one embodiment, the area of the second preset active layer may be SA2, the area of the third preset active layer may be SA3, the total area of the channel regions of the at least one second transistor corresponding to the second preset active layer may be SC2, and the total area of the channel regions of the at least one second transistor corresponding to the third preset active layer may be SC3. The area of the non-channel region of the at least one second transistor corresponding to the second preset active layer may be greater than the area of the non-channel region of the at least one second transistor corresponding to the third preset active layer, i.e., SA2−SC2>SA3−SC3.

In another embodiment, the area of the third preset active layer may be greater than the area of the second preset active layer. By increasing the area of the third preset active layer in the display region of the display panel, the antistatic capability of the display region of the display panel may be improved, and the probability of the display region of the display panel being damaged by static charges may be reduced.

It should be noted that in practical applications, an aspect ratio of the channel region of the active layer of the transistor may be a key feature that affects the performance of the transistor. For a transistor with specific performance, the aspect ratio may be a fixed value. Therefore, in one embodiment, the area of the non-channel region of the at least one second transistor corresponding to the third preset active layer may be greater than the area of the non-channel region of the at least one second transistor corresponding to the second preset active layer. Therefore, without changing the aspect ratio of the channel region of the second transistor corresponding to the third preset active layer, the antistatic capability of the third preset active layer may increase, and the probability of the display region of the display panel being damaged by static charges may be reduced.

Specifically, in one embodiment, the area of the second preset active layer may be SA2, the area of the third preset active layer may be SA3, the total area of the channel regions of the at least one second transistor corresponding to the second preset active layer may be SC2, and the total area of the channel regions of the at least one second transistor corresponding to the third preset active layer may be SC3. The area of the non-channel region of the at least one second transistor corresponding to the third preset active layer may be greater than the area of the non-channel region of the at least one second transistor corresponding to the second preset active layer, i.e., SA3−SC3>SA2−SC2.

Figure 11:
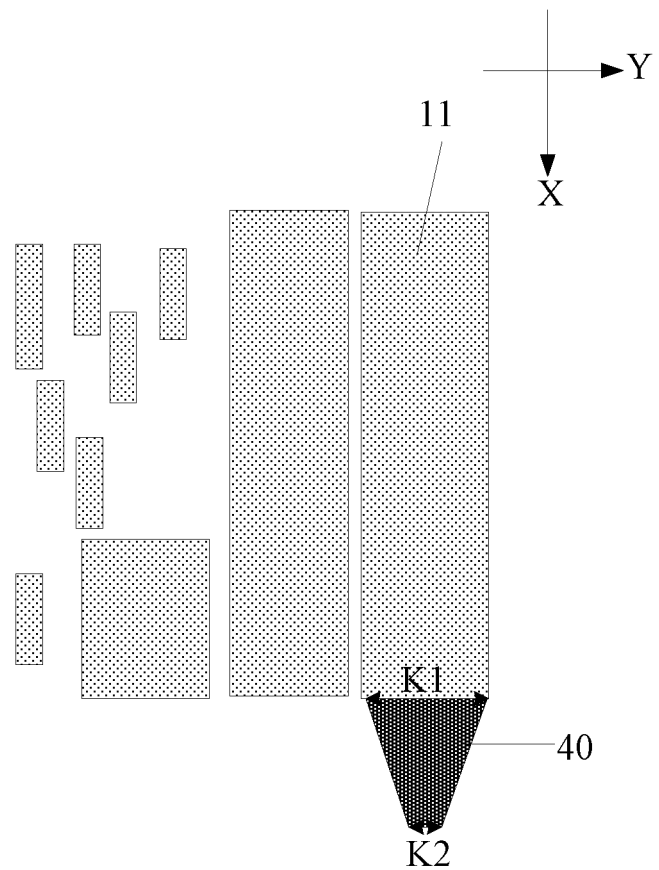
FIG. 11 illustrates a schematic diagram of a first side edge of a first preset active layer of at least one first active layer provided with a concave-convex structure of an exemplary display panel consistent with disclosed embodiments of the present disclosure.

On the basis of any of the foregoing embodiments, in one embodiment, referring to FIG. 11, at least one concave-convex structure 40 may be disposed on at least a first side edge of the first preset active layer 11. By disposing the concave-convex structure 40 on the first side edge of the first preset active layer 11, a corona discharge phenomenon on the first side edge of the first preset active layer 11 may increase, and the amount of static charges transferred from the frame region of the display panel to the display region of the display panel may be reduced.

Optionally, to reduce the amount of static charges transferred to the display region of the display panel when the tip of the concave-convex structure discharges, in one embodiment, referring to FIG. 2 and FIG. 11, the cascaded shift register may be extended along the first direction X, and the shift register may provide a driving signal to the pixel circuit located in the display region of the display panel along a second direction Y. The first direction X may be perpendicular to the second direction Y. The first side edge may be a corresponding side edge of the first preset active layer 11 along the first direction X. In another embodiment, the first side edge of the first preset active layer 11 may be in the second direction Y, and may be the side of the first preset active layer 11 facing away from the display region, which may not be limited by the present disclosure and may be determined by practical applications.

On the basis of any of the foregoing embodiments, in one embodiment, referring to FIG. 11, a width K1 of a side of the at least one concave-convex structure 40 adjacent to the first side edge may be greater than a width K2 of another side of the at least one concave-convex structure 40 facing away from the first side edge. Therefore, the side of the concave-convex structure 40 facing away from the first preset active layer 11 may discharge, and the influence of the discharge phenomenon on the first preset active layer 11 may be reduced.

Figure 12:
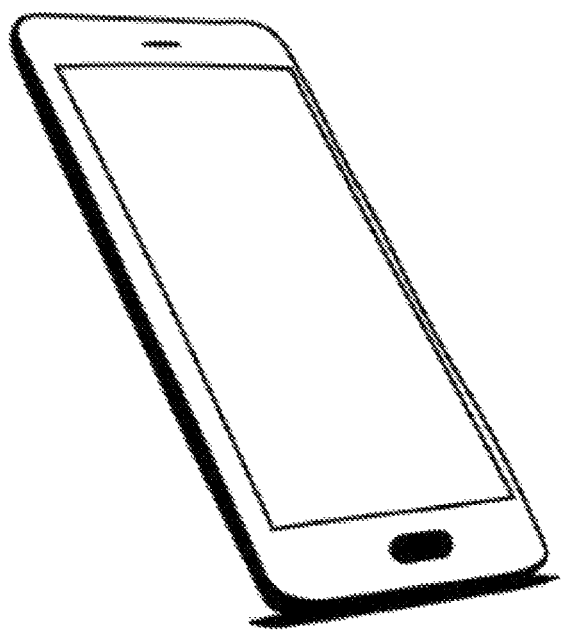
FIG. 12 illustrates a schematic diagram of an exemplary display device consistent with disclosed embodiments of the present disclosure.

In addition, referring to FIG. 12, the present disclosure also provides a display device. The display device may include a display panel provided in any of the foregoing embodiments. Optionally, the display device may be a device with a display function, such as a mobile phone, a computer, a tablet, a TV, etc., which may not be limited by the present disclosure, and may be determined by practical applications.

Accordingly, in the disclosed display panel and display device, the area of the first preset active layer may be greater than the area of the second preset active layer, and the area of the first preset active layer may be greater than the area of the third preset active layer. By increasing the area of the first preset active layer located in the shift register, the resistance of the first preset active layer located in the frame region may increase, thereby increasing the blocking effect of the first preset active layer against static charges, reducing the probability of the static charges in the frame region of the display panel being transferred to the display region, further reducing the probability of the display region of the display panel being damaged by static charges, and improving the quality of the display panel.

The various parts in the present disclosure may be described in a combination of parallel and progressive manner. Each part may focus on the difference from any other part, and the same or similar features between the various parts may be referred to each other.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising at least one driving circuit and at least one pixel circuit, wherein:
   a driving circuit of the at least one driving circuit provides a driving signal for a pixel circuit of the at least one pixel circuit, the driving circuit includes N-level shift registers connected in cascade, wherein N is greater than or equal to two, and the pixel circuit provides a display signal for a display unit of the display panel;
   a shift register of the N-level shift registers includes at least one first transistor, wherein the at least one first transistor includes at least one first active layer, and an active layer with a largest area among the at least one first active layer is a first preset active layer;
   the pixel circuit includes at least one second transistor, the at least one second transistor includes at least one second active layer, an active layer with a largest area among active layers containing silicon of the at least one second active layer is a second preset active layer, and an active layer with a largest area among active layers containing an oxide semiconductor of the at least one second active layer is a third preset active layer; and
   the first preset active layer is an active layer containing silicon, the shift register of the N-level shift registers further includes a fourth preset active layer, and an active layer with a largest area among active layers containing oxide semiconductor of the at least one first active layer is the fourth preset active layer; or the first preset active layer is an active layer containing oxide semiconductor, the shift register of the N-level shift registers further includes a fourth preset active layer, and an active layer with a largest area among active layers containing silicon of the at least one first active layer is the fourth preset active layer;
wherein a sum of an area of the first preset active layer and an area of the fourth preset active layer is greater than a sum of an area of the second preset active layer and an area of the third preset active layer.

2. The display panel according to claim 1, wherein:
the area of the first preset active layer is SA1, the area of the second preset active layer is SA2, the area of the third preset active layer is SA3, and the area of the fourth preset active layer is SA4; and
a sum of areas of channel regions of the at least one first transistor corresponding to the first preset active layer is SC1, a sum of areas of channel regions of the at least one second transistor corresponding to the second preset active layer is SC2, a sum of areas of channel regions of the at least one second transistor corresponding to the third preset active layer is SC3, and a sum of areas of channel regions of the at least one first transistor corresponding to the fourth preset active layer is SC4;
wherein (SA1−SC1)+(SA4−SC4)>(SA2−SC2)+(SA3−SC3).

3. The display panel according to claim 2, wherein:
the first preset active layer contains silicon, and the fourth preset active layer contains oxide semiconductor; and
(SA1−SC1)>(SA2−SC2), and/or (SA4−SC4)>(SA3−SC3).

4. The display panel according to claim 2, wherein:
the first preset active layer contains oxide semiconductor, and the fourth preset active layer contains silicon; and
(SA4−SC4)>(SA2−SC2), and/or (SA1−SC1)>(SA3−SC3).

5. The display panel according to claim 1, wherein:
the second preset active layer is an active layer corresponding to a driving transistor of the pixel circuit; and
the third preset active layer is an active layer corresponding to a switching transistor of the pixel circuit;
wherein the area of the second preset active layer is greater than the area of the third preset active layer.

6. The display panel according to claim 5, wherein:
the area of the second preset active layer is SA2, and the area of the third preset active layer is SA3; and
a sum of areas of channel regions of the at least one second transistor corresponding to the second preset active layer is SC2, and a sum of areas of channel regions of the at least one second transistor corresponding to the third preset active layer is SC3;
wherein (SA3−SC3)<(SA2−SC2).

7. The display panel according to claim 1, wherein:
the second preset active layer is an active layer corresponding to a driving transistor of the pixel circuit; and
the third preset active layer is an active layer corresponding to a switching transistor of the pixel circuit;
wherein the area of the third preset active layer is greater than the area of the second preset active layer.

8. The display panel according to claim 7, wherein:
the area of the second preset active layer is SA2, and the area of the third preset active layer is SA3; and
a sum of areas of channel regions of the at least one second transistor corresponding to the second preset active layer is SC2, and a sum of areas of channel regions of the at least one second transistor corresponding to the third preset active layer is SC3;
wherein (SA3−SC3)>(SA2−SC2).

9. The display panel according to claim 1, wherein:
at least a first side edge of the first preset active layer is provided with at least one concave-convex structure.

10. The display panel according to claim 9, wherein:
a width of a side of the at least one concave-convex structure adjacent to the first side edge is greater than a width of another side of the at least one concave-convex structure facing away from the first side edge.

11. The display panel according to claim 9, wherein:
the N-level shift registers are extended along a first direction, and the shift register provides the driving signal to the pixel circuit disposed in the display region of the display panel along a second direction, wherein the first direction is perpendicular to the second direction, and the first side edge is a corresponding side edge of the first preset active layer along the first direction.

12. The display panel according to claim 1, wherein:
the area of the first preset active layer is greater than a sum of the area of the second preset active layer and the area of the third preset active layer.

13. The display panel according to claim 12, wherein:
the area of the first preset active layer is SA1, the area of the second preset active layer is SA2, and the area of the third preset active layer is SA3; and
a sum of areas of channel regions of the at least one first transistor corresponding to the first preset active layer is SC1, a sum of areas of channel regions of the at least one second transistor corresponding to the second preset active layer is SC2, and a sum of areas of channel regions of the at least one second transistor corresponding to the third preset active layer is SC3;
wherein (SA1−SC1)>(SA2−SC2) and/or (SA1−SC1)>(SA3−SC3).

14. The display panel according to claim 13, wherein:
(SA1−SC1)>(SA2−SC2)+(SA3−SC3).

15. The display panel according to claim 1, wherein:
the shift register further includes a fifth preset active layer, wherein the fifth preset active layer is an active layer having an area only smaller than the first preset active layer among the at least one first active layer, an area of the fifth preset active layer is greater than the area of the second preset active layer, and the area of the fifth preset active layer is greater than the area of the third preset active layer.

16. The display panel according to claim 15, wherein:
the area of the fifth preset active layer is greater than a sum of the area of the second preset active layer and the area of the third preset active layer.

17. The display panel according to claim 15, wherein:
the area of the fifth preset active layer is SA5, the area of the second preset active layer is SA2, and the area of the third preset active layer is SA3; and
a sum of areas of channel regions of the at least one first transistor corresponding to the fifth preset active layer is SC5, a sum of areas of channel regions of the at least one second transistor corresponding to the second preset active layer is SC2, and a sum of areas of channel regions of the at least one second transistor corresponding to the third preset active layer is SC3;
wherein (SA5−SC5)>(SA2−SC2), and/or (SA5−SC5)>(SA3−SC3).

18. The display panel according to claim 17, wherein:
(SA5−SC5)>(SA2−SC2)+(SA3−SC3).

19. The display panel according to claim 15, wherein:
the N-level shift registers are extended along a first direction, and the shift register provides the driving signal to the pixel circuit disposed in the display region of the display panel along a second direction, wherein the first direction is perpendicular to the second direction, and using the second direction as a projection direction, at least a portion of the first preset active layer does not overlap with the fifth preset active layer.

20. A display device, comprising a display panel, wherein the display panel includes at least one driving circuit and at least one pixel circuit, wherein:
   a driving circuit of the at least one driving circuit provides a driving signal for a pixel circuit of the at least one pixel circuit, the driving circuit includes N-level shift registers connected in cascade, wherein N is greater than or equal to two, and the pixel circuit provides a display signal for a display unit of the display panel;
   a shift register of the N-level shift registers includes at least one first transistor, wherein the at least one first transistor includes at least one first active layer, and an active layer with a largest area among the at least one first active layer is a first preset active layer;
   the pixel circuit includes at least one second transistor, the at least one second transistor includes at least one second active layer, an active layer with a largest area among active layers containing silicon of the at least one second active layer is a second preset active layer, and an active layer with a largest area among active layers containing an oxide semiconductor of the at least one second active layer is a third preset active layer; and
   the first preset active layer is an active layer containing silicon, the shift register of the N-level shift registers further includes a fourth preset active layer, and an active layer with a largest area among active layers containing oxide semiconductor of the at least one first active layer is the fourth preset active layer; or the first preset active layer is an active layer containing oxide semiconductor, the shift register of the N-level shift registers further includes a fourth preset active layer, and an active layer with a largest area among active layers containing silicon of the at least one first active layer is the fourth preset active layer;
   wherein a sum of an area of the first preset active layer and an area of the fourth preset active layer is greater than a sum of an area of the second preset active layer and an area of the third preset active layer.

* * * * *